(12) United States Patent
Savandaiah et al.

(10) Patent No.: US 10,546,733 B2
(45) Date of Patent: Jan. 28, 2020

(54) ONE-PIECE PROCESS KIT SHIELD

(71) Applicant: APPLIED MATERIALS, INC., Santa Clara, CA (US)

(72) Inventors: Kirankumar Savandaiah, Bangalore (IN); Ryan Hanson, Cupertino, CA (US); Ruxiao An, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 200 days.

(21) Appl. No.: 14/960,890

(22) Filed: Dec. 7, 2015

(65) Prior Publication Data

US 2016/0189938 A1 Jun. 30, 2016

Related U.S. Application Data

(60) Provisional application No. 62/098,907, filed on Dec. 31, 2014.

(51) Int. Cl.
*C23C 14/35* (2006.01)
*H01J 37/34* (2006.01)
*H01J 37/32* (2006.01)

(52) U.S. Cl.
CPC ..... *H01J 37/3411* (2013.01); *H01J 37/32431* (2013.01); *H01J 37/32477* (2013.01); *H01J 37/32495* (2013.01); *H01J 37/32504* (2013.01); *H01J 37/32513* (2013.01); *H01J 37/32522* (2013.01); *H01J 37/34* (2013.01); *H01J 37/3441* (2013.01); *H01J 37/3447* (2013.01)

(58) Field of Classification Search
CPC ............... H01J 37/3447; H01J 37/3441; H01J 37/32651
See application file for complete search history.

(56) References Cited

U.S. PATENT DOCUMENTS

| 3,212,992 | A | * | 10/1965 | Salesse | F28F 1/12 138/42 |
| 5,824,197 | A | * | 10/1998 | Tanaka | C23C 14/046 204/192.12 |
| 6,837,974 | B2 | | 1/2005 | Lawson et al. | |
| 7,981,262 | B2 | | 7/2011 | Pavloff et al. | |
| 2007/0046167 | A1 | | 3/2007 | Lantis et al. | |
| 2007/0102286 | A1 | * | 5/2007 | Scheible | C23C 14/3407 204/298.01 |

(Continued)

FOREIGN PATENT DOCUMENTS

| CN | 102994977 A | 3/2013 |
| TW | 201203332 A | 1/2012 |

OTHER PUBLICATIONS

International Search Report and Written Opinion dated Mar. 29, 2016 for PCT Application No. PCT/US2015/064454.

(Continued)

*Primary Examiner* — Jason Berman
(74) *Attorney, Agent, or Firm* — Moser Taboada; Alan Taboada

(57) ABSTRACT

Embodiments of process kit shields and process chambers incorporating same are provided herein. In some embodiments, a one-piece process kit shield includes a cylindrical body having an upper portion and a lower portion; a heat transfer channel extending through the upper portion; and a cover ring section extending radially inward from the lower portion.

20 Claims, 3 Drawing Sheets

(56) References Cited

U.S. PATENT DOCUMENTS

| | | | |
|---|---|---|---|
| 2008/0006523 A1 | 1/2008 | Hosokawa et al. | |
| 2008/0164146 A1* | 7/2008 | Ivanov | H01J 37/34 204/298.02 |
| 2011/0278165 A1 | 11/2011 | Rasheed et al. | |
| 2013/0056347 A1* | 3/2013 | West | C23C 14/3407 204/192.12 |
| 2013/0277203 A1 | 10/2013 | Rasheed et al. | |
| 2014/0027275 A1 | 1/2014 | Kao | |
| 2014/0174910 A1 | 6/2014 | Dedontney | |

OTHER PUBLICATIONS

Search Report from the State Intellectual Property Office of the People's Republic of China dated Sep. 5, 2018 received for China Application No. 2015800703391.

Search Report for Taiwan dated Feb. 25, 2019 for Application No. 104142135.

\* cited by examiner

ONE-PIECE PROCESS KIT SHIELD

CROSS-REFERENCE TO RELATED APPLICATIONS

This application claims benefit of U.S. provisional patent application Ser. No. 62/098,907, filed Dec. 31, 2014, which is herein incorporated by reference in its entirety.

FIELD

Embodiments of the present disclosure generally relate to substrate processing equipment.

BACKGROUND

A process kit shield may be used in, for example, a physical vapor deposition (PVD) chamber to separate a processing volume from a non-processing volume. In PVD chambers configured to deposit aluminum on a substrate, the process kit shield may be fabricated, for example, from stainless steel (SST). The SST process kit shield can be recycled multiple times as an aluminum layer deposited on the process kit shield during processing can be preferentially etched away from the base SST shield material. However, the inventors have been working on depositing relatively thick aluminum films on the substrate using significantly increased process power and deposition time as compared to conventional aluminum deposition processes.

For the thicker aluminum deposition process, the inventors have observed that the temperature of the process kit shield goes sufficiently high to undesirably result in whisker growth on the substrate. The inventors believe that whiskers are formed when the process kit surrounding the substrate does not have sufficient time to cool down between subsequent processes. The deposition process heats the substrate significantly more than the heated substrate support. Because the substrate is electrostatically chucked to the pedestal, the wafer is not free to bow under the thermal stress caused by the mismatch in the coefficient of thermal expansion (CTE) between the thick aluminum film and the substrate (e.g., silicon). When the film stress on the substrate gets high enough, whiskers pop out of the film to reduce the film stress. The inventors have further observed that high temperatures in the structures surrounding the substrate also adversely affect the reflectivity of the aluminum film deposited on the substrate. The temperature of the cover ring and shield play an important role in cooling the substrate via thermal radiation, and in minimizing whisker formation.

Furthermore, when the process kit undergoes thermal cycling from plasma heating and subsequent cooling while the plasma is off, a film deposited on the process kit experiences thermal stress that results from the mismatch in the CTE between the film and the underlying component material. When that stress exceeds the limits of adhesion, particles flake off of the process kit and land on the substrate.

Accordingly, the inventors have provided embodiments of improved process kit shields as disclosed herein.

SUMMARY

Embodiments of process kit shields and process chambers incorporating same are provided herein. In some embodiments, a one-piece process kit shield includes a cylindrical body having an upper portion and a lower portion; a heat transfer channel extending through the upper portion; and a cover ring section extending radially inward from the lower portion.

In some embodiments, a one-piece process kit shield includes a cylindrical body having an upper portion and a lower portion; an adapter section extending radially outward from the upper portion and having a resting surface to support the one-piece shield on walls of a chamber and a sealing surface on which a chamber lid rests to seal off an interior volume of the chamber when the one-piece shield is placed in the chamber; a heat transfer channel extending through the adapter section; a cover ring section extending radially inward from the lower portion; and a turbulence generating device disposed within the heat transfer channel.

In some embodiments, process chamber includes a chamber wall defining an inner volume within the process chamber; a sputtering target disposed in an upper section of the inner volume; a substrate support having a support surface to support a substrate below the sputtering target; a one-piece process kit shield surrounding the sputtering target and the substrate support. The one piece process kit shield includes a cylindrical body having an upper portion surrounding the sputtering target and a lower portion surrounding the substrate support; a heat transfer channel extending through the upper portion; and a cover ring section extending radially inward from the lower portion and surrounding the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
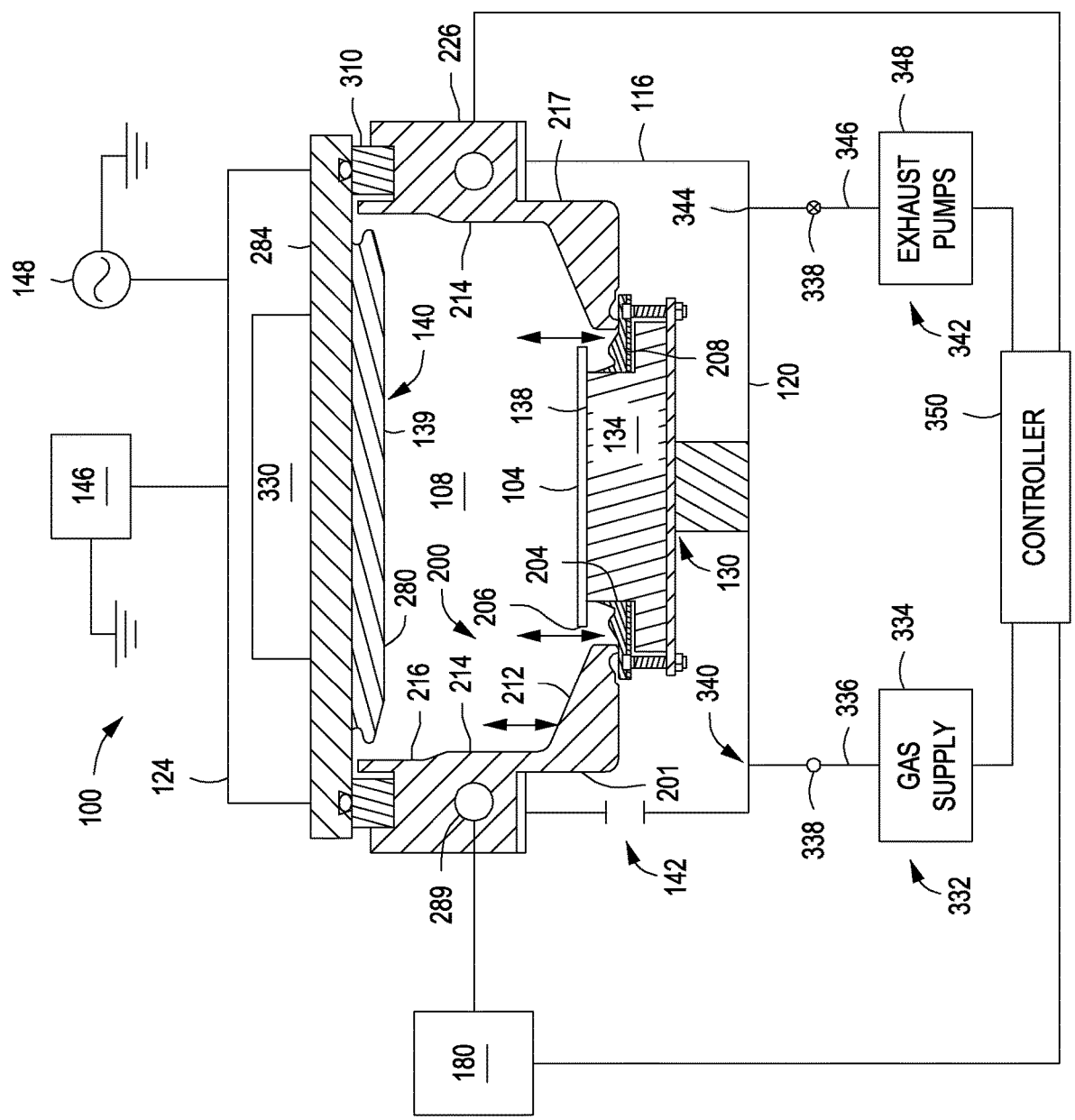
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kit shields and process chambers incorporating such process kit shields are provided herein. In some embodiments, a one-piece process kit shield including an adapter section and a cover ring section corresponding to an adapter and cover ring, respectively, are provided herein. The adapter section may include a heat transfer channel to cool the one-piece process kit shield. The one-piece process kit shield advantageously improves cooling of the shield and improved thermal conductivity between various portions of the shield, which were previously separate components.

FIG. 1 depicts a schematic, cross-sectional view of an illustrative process chamber 100 (e.g., a PVD chamber) having a process kit shield in accordance with some embodiments of the present disclosure. Examples of PVD chambers suitable for use with process kit shields of the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140. The substrate support surface 138 of the pedestal 134 receives and supports the substrate 104 during processing. The pedestal 134 may include an electrostatic chuck or a heater (such as an electrical resistance heater, heat exchanger, or other suitable heating device). In operation, a substrate 104 is introduced into the process chamber 100 through a substrate loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto The substrate support 130 during placement of the substrate 104 on the substrate support 130 by a robot arm. The pedestal 134 can be maintained at an electrically floating potential or grounded during plasma operation.

Figure 2:
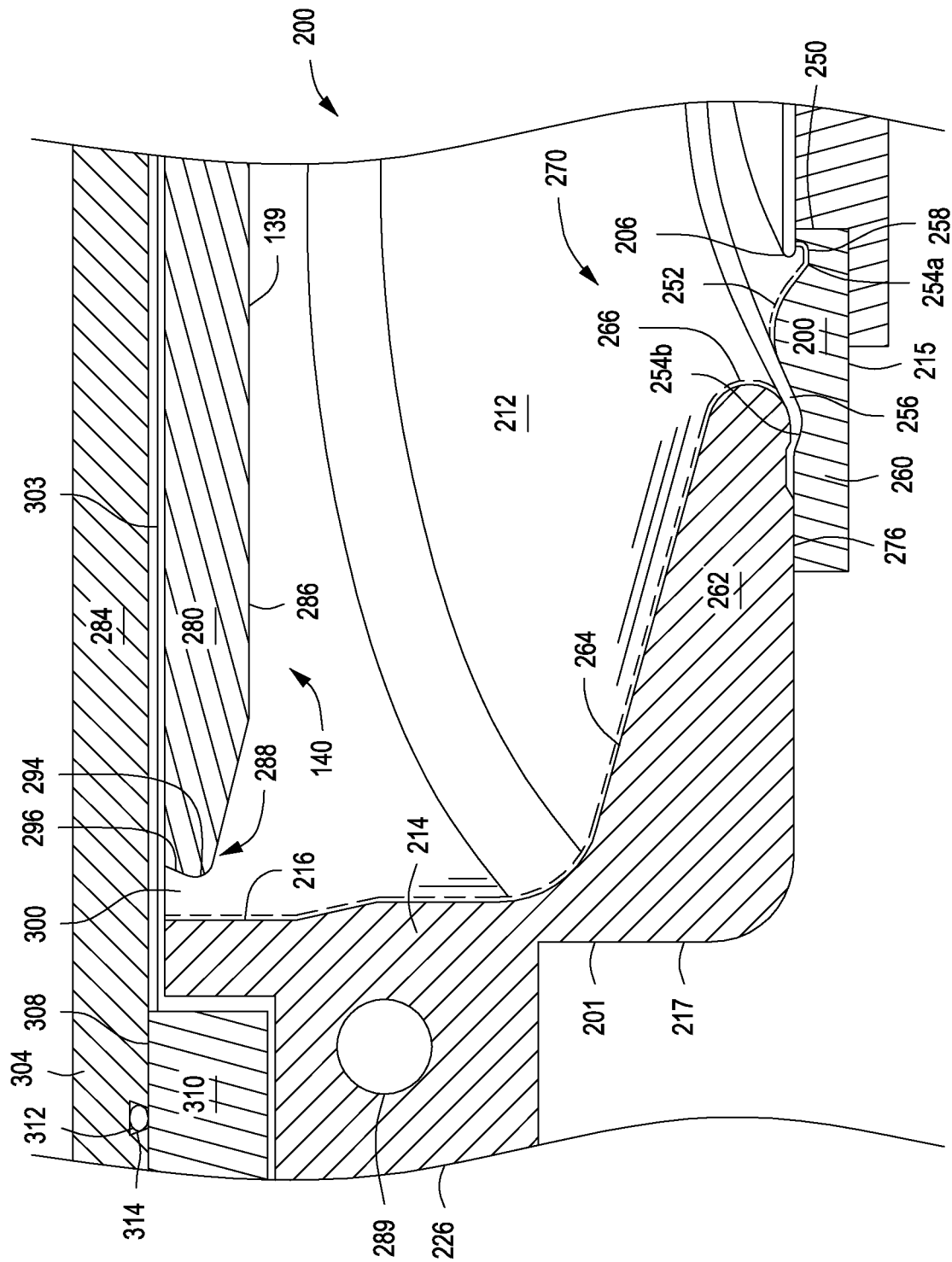
FIG. 2 depicts a schematic cross sectional view of a process kit shield in accordance with some embodiments of the present disclosure.
Figure 3:
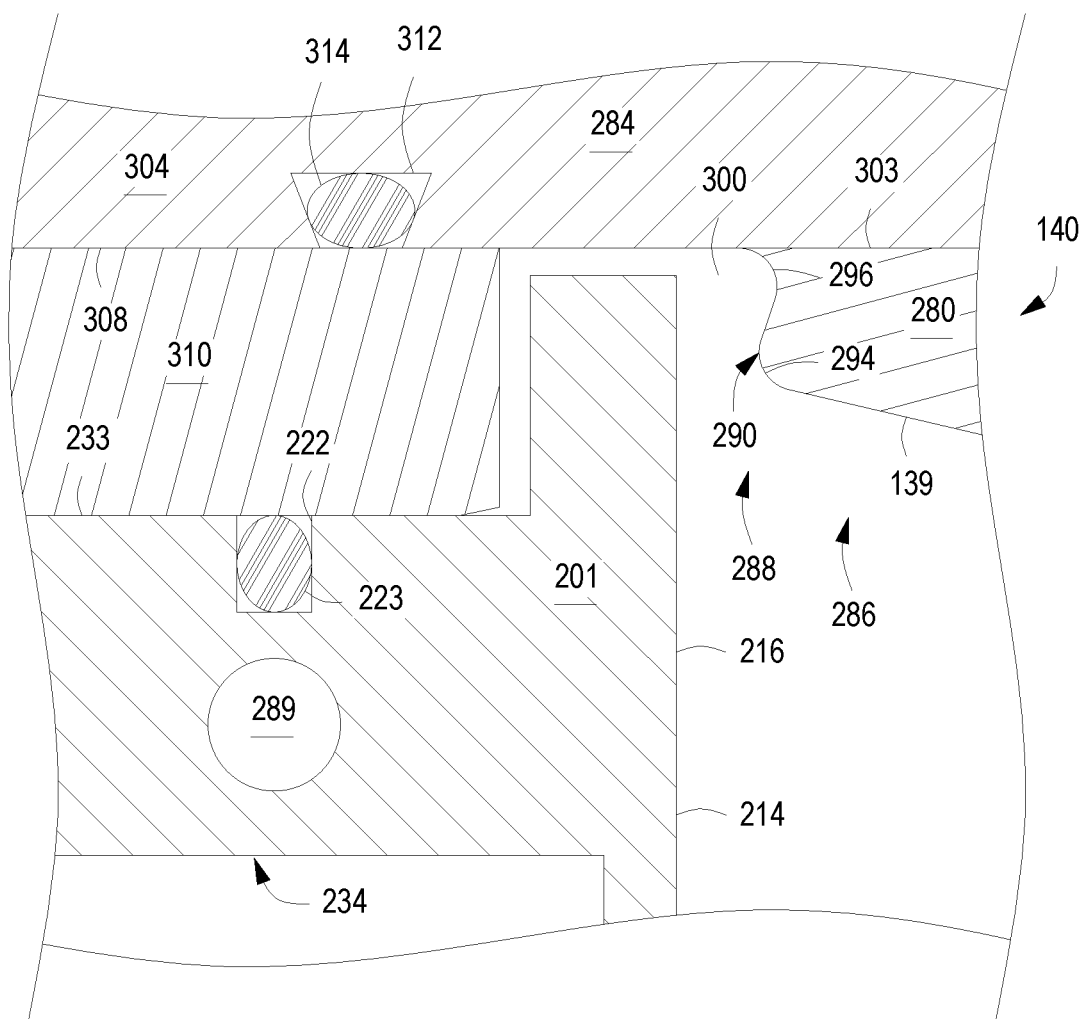
FIG. 3 depicts a schematic cross sectional view of an upper portion of a process kit shield in accordance with some embodiments of the present disclosure.

The process chamber 100 also contains a process kit 200, as shown in FIGS. 2 and 3, which comprises various components that can be easily removed from the process chamber 100, for example, to clean sputtering deposits off the component surfaces, replace or repair eroded components, or to adapt the process chamber 100 for other processes. The inventors have discovered that thermal resistances at contact interfaces of a process kit shield, a process kit adapter, and a process kit cover ring adversely affect shield temperatures. Furthermore, low clamping forces between the shield and the adapter result in poor heat transfer between the adapter and the shield, even with coolant channels used to enhance heat transfer rates. The low heat transfer rate problem is further exacerbated with respect to the cover ring because the cover ring is a floating element (i.e., not coupled to the shield). Thus, the inventors have designed a process kit having a one-piece shield 201 that advantageously provides improved cooling/heating of the shield and the cover ring.

In some embodiments, the one-piece shield 201 includes a cylindrical body 214 having a diameter sized to encircle the sputtering surface 139 of the sputtering target 140 and the substrate support 130 (e.g., a diameter larger than the sputtering surface 139 and larger than the support surface of the substrate support 130). The cylindrical body 214 has an upper portion 216 that surrounds the outer edge of the sputtering surface 139 of the sputtering target 140 and a lower portion 217 that surrounds the substrate support 130. The upper portion 216 includes an adapter section 226 for supporting the one-piece shield 201 on the sidewall 116 and a cover ring section 212 for placement about a peripheral wall 204 of the substrate support 130.

The process kit 200 further comprises a deposition ring 208 disposed below the cover ring section 212. A bottom surface of the cover ring section 212 interfaces with the deposition ring 208. The deposition ring 208 comprises an annular band 215 surrounding The substrate support 130. The cover ring section 212 at least partially covers the deposition ring 208. The deposition ring 208 and cover ring section 212 cooperate with one another to reduce formation of sputter deposits on the peripheral walls 204 of The substrate support 130 and an overhanging edge 206 of the substrate 104.

The one-piece shield 201 encircles the sputtering surface 139 of the sputtering target 140 that faces the substrate support 130 and the outer periphery of the substrate support 130. The one-piece shield 201 covers and shadows the sidewalls 116 of the process chamber 100 to reduce deposition of sputtering deposits originating from the sputtering surface 139 of the sputtering target 140 onto the components and surfaces behind the one-piece shield 201. For example, the one-piece shield 201 can protect the surfaces of The substrate support 130, overhanging edge 206 of the substrate 104, sidewalls 116 and bottom wall 120 of the process chamber 100.

As shown in FIGS. 1-3, the adapter section 226 extends radially outward from the upper portion 216 and the cover ring section extends radially inward from the lower portion 217 of the cylindrical body 214. The adapter section 226 includes a sealing surface 233 and a resting surface 234 opposite the sealing surface 233. The sealing surface 233 contains an O-ring groove 222 to receive an O-ring 223 to form a vacuum seal. The adapter section 226 comprises a resting surface 234 to rest upon the sidewalls 116 of the process chamber 100.

The adapter section 226 supports the one-piece shield 201 and can serve as a heat exchanger about a sidewall 116 of the process chamber 100. In some embodiments, a heat transfer channel 289 is disposed in the upper portion 216 to flow a heat transfer medium. In some embodiments, the heat transfer channel 289 is disposed in the adapter section 226. Because the one-piece shield 201 is of unitary construction, the heat transfer medium flowing through the heat transfer channel 289 directly cools/heats the areas of the one-piece shield 201 corresponding to the shield and cover ring (i.e., the cylindrical body 214 and cover ring section 212, respectively). Furthermore, the unitary construction of the one-piece shield 201 advantageously allows for a direct coupling of a heat transfer medium supply 180 to the shield, which was previously indirectly coupled to a heat transfer medium supply via the adapter. The heat transfer medium supply 180 flows a heat transfer medium through the heat transfer channel 289 at a flowrate sufficient to maintain a desired shield temperature.

Figure 4:
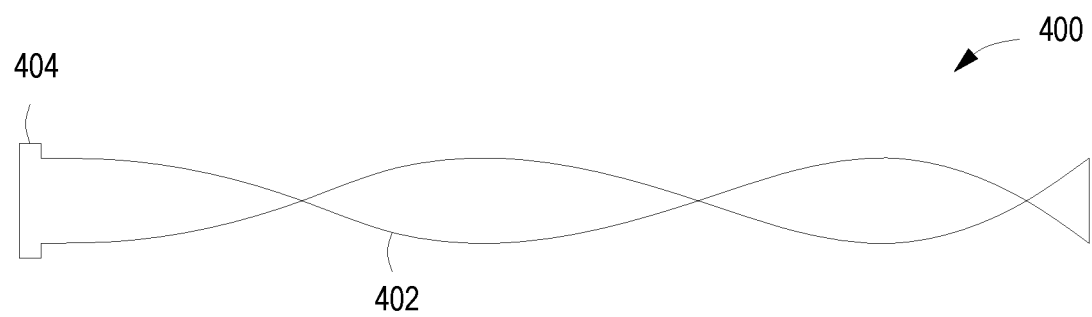
FIG. 4 depicts a schematic side view of a turbulence generating device for use in a process kit shield in accordance with some embodiments of the present disclosure.

FIG. 4 illustrates a turbulence generating device 400 in accordance with some embodiments of the present disclosure. In some embodiments, the heat transfer channel 289 may include one or more turbulence generating devices 400 (shown in FIG. 4). The turbulence generating device 400 includes a helically shaped body 402 to induce turbulence in the flow of the heat transfer medium and a base 404. The base 404 is configured to engage with walls of the heat transfer channel 289 to prevent the turbulence generating device 400 from moving as the heat transfer medium flows past the turbulence generating device 400. The turbulence induced by the turbulence generating device 400 advantageously improves the rate of heat transfer between the heat transfer medium and the one-piece shield 201.

Returning to FIG. 2, the one-piece shield 201 allows better heat transfer from the one-piece shield 201 to and which reduces thermal expansion stresses on the material deposited on the shield. Portions of the one-piece shield 201 can become excessively heated by exposure to the plasma formed in the substrate processing chamber, resulting in thermal expansion of the shield and causing sputtering deposits formed on the shield to flake off from the shield and fall upon and contaminate the substrate 104. The unitary construction of the adapter section 226 and the cylindrical body 214 results in improved thermal conductivity between the adapter section 226 and the cylindrical body 214.

In some embodiments, the one-piece shield 201 comprises a unitary structure which is made from a monolith of material. For example, the one-piece shield 201 may be formed of stainless steel or aluminum. The unitary construction of the one-piece shield 201 is advantageous over conventional shields which include multiple components, often two or three separate pieces to make up the complete shield. For example, a single piece shield is more thermally uniform than a multiple-component shield, in both heating and cooling processes. For example, the one-piece shield 201 eliminates all thermal interfaces between cylindrical body 214, the adapter section 226, and the cover ring section 212 allowing for more control over the heat exchange between these sections. In some embodiments, the heat transfer medium supply 180 flows a coolant through the heat transfer channel 289 to combat the adverse effects of an overheated shield on the sputtered material deposited on the substrate 104, as explained above. In some embodiments, the heat transfer medium supply 180 flows a heated fluid through the heat transfer channel 289 to mitigate the difference between the coefficients of the thermal expansion of the sputtered material and the shield.

Furthermore, a shield with multiple components is more difficult and laborious to remove for cleaning. The one-piece shield 201 has a continuous surface exposed to the sputtering deposits without interfaces or corners that are more difficult to clean out. The one-piece shield 201 also more effectively shields the chamber walls 106 from sputter deposition during process cycles. In some embodiments, surfaces of the one-piece shield 201 exposed to the inner volume 108 in the process chamber 100 may be bead blasted to reduce particle shedding and prevent contamination within the process chamber 100.

The deposition ring 208 comprises an annular band 215 that extends about and surrounds the peripheral wall 204 of The substrate support 130 as shown in FIG. 2. The annular band 215 comprises an inner lip 250 which extends transversely from the annular band 215 and is substantially parallel to the peripheral wall 204 of The substrate support 130. The inner lip 250 terminates immediately below the overhanging edge 206 of the substrate 104. The inner lip 250 defines an inner perimeter of the deposition ring 208 which surrounds the periphery of the substrate 104 and substrate support 130 to protect regions of The substrate support 130 that are not covered by the substrate 104 during processing. For example, the inner lip 250 surrounds and at least partially covers the peripheral wall 204 of The substrate support 130 that would otherwise be exposed to the processing environment, to reduce or even entirely preclude deposition of sputtering deposits on the peripheral wall 204. Advantageously, the deposition ring 208 can be easily removed to clean sputtering deposits from the exposed surfaces of the deposition ring 208 so that The substrate support 130 does not have to be dismantled to be cleaned. The deposition ring 208 can also serve to protect the exposed side surfaces of The substrate support 130 to reduce their erosion by the energized plasma species.

In some embodiments, the annular band 215 of the deposition ring 208 has a semi-circular protuberance 252 that extends along the central portion of the annular band 215 with radially inward dips 254a, 254b on either side of the semi-circular protuberance 252. The radially inward dip 254a is spaced apart from the cover ring section 212 to form an arc-shaped gap 256 between the deposition ring 208 and the cover ring section 212, which acts as a labyrinth to reduce penetration of plasma species into the arc-shaped gap 256. An open inner channel 258 lies between the inner lip 250 and the semi-circular protuberance 252. The open inner channel 258 extends radially inward to terminate at least partially below the overhanging edge 206 of the substrate 104. The open inner channel 258 facilitates the removal of sputtering deposits from these portions during cleaning of the deposition ring 208. The deposition ring 208 also has a ledge 260 which extends outward and is located radially outward of the semi-circular protuberance 252. The ledge 260 serves to partially support the cover ring section 212, thus providing an additional support for the one-piece shield 201.

The cover ring section 212 encircles and at least partially covers the deposition ring 208 to receive, and thus, shadow the deposition ring 208 from the bulk of the sputtering deposits. The cover ring section 212 comprises an annular wedge 262 comprising an inclined upper surface 264 that is sloped radially inwards and encircles the substrate support 130. The inclined upper surface 264 of the annular wedge 262 has an inner periphery 266 including a projecting brim 270 which overlies the radially inward dip 254a comprising an open inner channel 258 of the deposition ring 208. The projecting brim 270 reduces deposition of sputtering deposits on the open inner channel 258 of the deposition ring 208. Advantageously, the projecting brim 270 projects a distance corresponding to at least about half the width of the arc-shaped gap 256 formed with the deposition ring 208. The projecting brim 270 is sized, shaped, and positioned to cooperate with and complement the arc-shaped gap 256 to form a convoluted and constricted flow path between the cover ring section 212 and deposition ring 208, thus inhibiting the flow of process deposits onto the peripheral wall 204.

The constricted flow path of the narrow arc-shaped gap 256 restricts the build-up of low-energy sputter deposits on the mating surfaces of the deposition ring 208 and cover ring section 212, which would otherwise cause them to stick to one another or to the overhanging edge 206 of the substrate 104. The open inner channel 258 of the deposition ring 208 which extends underneath the overhanging edge 206 is designed in conjunction with shadowing from the projecting brim 270 of the cover ring section 212 to collect sputter deposits in a sputtering chamber, while reducing or even substantially precluding sputter deposition on the mating surfaces of the cover ring section 212 and the deposition ring 208. The inclined upper surface 264 may be inclined at an angle of from at least about 15°. The angle of the inclined upper surface 264 of the cover ring section 212 is designed to minimize the buildup of sputter deposits nearest to the overhanging edge 206 of the substrate 104, which would otherwise negatively impact the deposition uniformity across the substrate 104.

The cover ring section 212 comprises a footing 276 extending downward from the inclined upper surface 264 of the annular wedge 262, to rest upon the ledge 260 of the deposition ring 208. The footing 276 extends downwardly from the wedge 262 to press against the deposition ring 208 substantially without cracking or fracturing the deposition ring 208.

As shown in FIGS. 1-3, the sputtering target 140 comprises a sputtering plate 280 mounted to a backing plate 284. The sputtering plate 280 comprises a material to be sputtered onto the substrate 104. The sputtering plate 280 may have a central cylindrical mesa 286 having the sputtering surface 139 that forms a plane that is parallel to the plane of the substrate 104. An annular inclined rim 288 surrounds the cylindrical mesa 286. The annular inclined rim 288 may be inclined relative to the plane of the cylindrical mesa 286 by an angle of at least about 8°, for example, from about 10° to about 20°. A peripheral inclined sidewall 290 having a protrusion 294 and a recess 296 surrounds the annular inclined rim 288. The peripheral incline sidewall 290 may be inclined relative to the plane of the cylindrical mesa 286 by an angle of at least about 60°, for example, from about 75° to about 85°.

The complex shape of the annular inclined rim 288 and peripheral inclined sidewall 290 that is adjacent to the upper portion 216 of the one-piece shield 201 forms a convoluted gap 300 comprising a dark space region. The dark space region is an area which is highly depleted of free electrons and which can be modeled as a vacuum. Control of the dark space region advantageously prevents plasma entry into the dark space region, arcing, and plasma instability. The shape of the gap 300 acts as a labyrinth that impedes the passage of sputtered plasma species through the gap 300, and thus, reduces the accumulation of sputtered deposits on the surfaces of the peripheral target region.

The sputtering plate 280 comprises a metal or metal compound. For example, the sputtering plate 280 can be a metal, such as, for example aluminum, copper, tungsten, titanium, cobalt, nickel or tantalum. The sputtering plate 280 can also be a metal compound, such as for example, tantalum nitride, tungsten nitride or titanium nitride.

The backing plate 284 which has a support surface 303 to support the sputtering plate 280 and a peripheral ledge 304 that extends beyond the radius of the sputtering plate 280. The backing plate 284 is made from a metal, such as, for example, stainless steel, aluminum, copper-chromium or copper-zinc. The backing plate 284 can be made from a material having a thermal conductivity that is sufficiently high to dissipate the heat generated in the sputtering target 140, which is formed in both the sputtering plate 280 and the backing plate 284. The heat is generated from the eddy currents that arise in these plates 280, 284 and also from the bombardment of energetic ions from the plasma onto the sputtering surface 139 of the sputtering target 140. The higher thermal conductivity of the backing plate 284 allows dissipation of the heat generated in the sputtering target 140 to the surrounding structures or even to a heat exchanger which may be mounted behind the backing plate 284 or may be in the backing plate 284, itself. For example, the backing plate 284 can comprise channels (not shown) to circulate a heat transfer fluid therein. A suitably high thermal conductivity of the backing plate 284 is at least about 200 W/mK, for example, from about 220 to about 400 W/mK. Such a thermal conductivity level allows the sputtering target 140 to be operated for longer process time periods by dissipating the heat generated in the sputtering target 140 more efficiently.

In combination with a backing plate 284 made of a material having a high thermal conductivity and low resistivity, or separately and by itself, the backing plate 284 may comprises a backside surface having one or more grooves (not shown). For example, a backing plate 284 could have a groove, such as annular groove, or a ridge, for cooling the backside 141 of the sputtering target 140. The grooves and ridges can also have other patterns, for example, rectangular grid pattern, chicken feet patterns, or simply straight lines running across the backside surface.

In some embodiments, the sputtering plate 280 may be mounted on the backing plate 284 by diffusion bonding, by placing the two plates 280, 284 on each other and heating the plates 280, 284 to a suitable temperature, typically at least about 200° C. Optionally, the sputtering target 140 may be a monolithic structure comprising a single piece of material having enough depth to serve as both the sputtering plate and backing plate.

The peripheral ledge 304 of the backing plate 284 comprises an outer footing 308 that rests on an isolator 310 in the process chamber 100 (FIGS. 2 and 3). The peripheral ledge 304 contains an O-ring groove 312 into which an O-ring 314 is placed to form a vacuum seal. The isolator 310 electrically isolates and separates the backing plate 284 from the process chamber 100, and is typically a ring formed of a dielectric or insulative material such as aluminum oxide. The peripheral ledge 304 is shaped to inhibit the flow or migration of sputtered material and plasma species through a gap between the sputtering target 140 and the isolator 310, to impede the penetration of low-angle sputtered deposits into the gap.

Returning to FIG. 1, the sputtering target 140 is connected to one or both of a DC power source 146 and an RF power source 148. The DC power source 149 can apply a bias voltage to the sputtering target 140 relative to the one-piece shield 201, which may be electrically floating during a sputtering process. While the DC power source 146 supplies power to the sputtering target 140, the one-piece shield 201, The substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 330 to shape a magnetic field about the sputtering target 140 to improve sputtering of the sputtering target 140. The capacitively generated plasma may be enhanced by a magnetic field generator 330 in which for example, a permanent magnet or electromagnetic coils may provide a magnetic field in the process chamber 100 that has a rotating magnetic field having an rotational axis that is perpendicular to the plane of the substrate 104. The process chamber 100 may, in addition or alternatively, comprise a magnetic field generator 330 that generates a magnetic field near the sputtering target 140 of the process chamber 100 to increase an ion density in a high-density plasma region adjacent to the sputtering target 140 to improve the sputtering of the target material.

The sputtering gas is introduced into the progress chamber 100 through a gas delivery system 332, which provides gas from a gas supply 334 via conduits 336 having gas flow control valves 338, such as a mass flow controllers, to pass a set flow rate of the gas therethrough. The gases are fed to a mixing manifold (not shown) in which the gases are mixed to form a desired process gas compostion and fed to a gas distributer 340 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by the RF power source 148 to form a plasma to sputter the sputtering target 140. Spent process gas and byproducts are exhausted from the process chamber 100 through an exhaust 342. The exhaust 342 comprises an exhaust port 344 that receives spent process gas and passes the spent gas to an exhaust conduit 346 having a throttle valve to control the pressure of the gas in the process chamber 100. The exhaust conduit 346 is connected to one or more exhaust pumps 348.

Various components of the process chamber 100 may be controlled by a controller 350. The controller 350 comprises program code having instruction sets to operate the components to process a substrate 104. For example, the controller 350 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 148 to set a gas energizing power level; temperature control instruction sets to control a temperature control system in The substrate support 130 or the heat transfer medium supply 180 to control a flowrate of the heat transfer medium to the heat transfer channel 289; and process monitoring instruction sets to monitor the process in the process chamber 100.

While the foregoing is directed to embodiments of the present disclosure, other and further embodiments of the disclosure may be devised without departing from the basic scope thereof.

The invention claimed is:

1. A one-piece process kit shield, comprising:
   a cylindrical body having an upper portion and a lower portion, wherein the upper portion includes an adapter section extending radially outward and having a resting surface to support the one-piece process kit shield on walls of a chamber and a sealing surface on which a chamber lid rests to seal off an interior volume of the chamber when the one-piece process kit shield is placed in the chamber;
   a heat transfer channel extending through the upper portion; and
   a cover ring section extending radially inward from the lower portion, wherein an opening disposed through the cylindrical body and the cover ring section define a process volume-facing surface of the one-piece process kit shield, and wherein a diameter of the process volume-facing surface decreases from the upper portion to the cover ring section.

2. The one-piece process kit shield of claim 1, wherein the heat transfer channel is disposed in the adapter section.

3. The one-piece process kit shield of claim 1, wherein the sealing surface has a channel to receive an isolator.

4. The one-piece process kit shield of claim 1, further comprising:
   a turbulence generating device disposed within the heat transfer channel.

5. The one-piece process kit shield of claim 4, wherein the turbulence generating device comprises:
   a helically shaped body to induce turbulence in a flow of a heat transfer medium; and
   a base configured to engage with walls of the heat transfer channel to prevent the turbulence generating device from moving as the heat transfer medium flows past the turbulence generating device.

6. The one-piece process kit shield of claim 1, wherein the one-piece process kit shield is formed of aluminum or stainless steel.

7. A one-piece process kit shield, comprising:
   a cylindrical body having an upper portion and a lower portion;
   an adapter section extending radially outward from the upper portion and having a resting surface to support the one-piece process kit shield on walls of a chamber and a sealing surface on which a chamber lid rests to seal off an interior volume of the chamber when the one-piece process kit shield is placed in the chamber;
   a heat transfer channel extending through the adapter section;
   a cover ring section extending radially inward from the lower portion, wherein an opening disposed through the cylindrical body and the cover ring section define a process volume-facing surface of the one-piece process kit shield, and wherein the process volume-facing surface extends downward and radially inward from the upper portion to the radially innermost portion of the cover ring section; and
   a turbulence generating device disposed within the heat transfer channel.

8. The one-piece process kit shield of claim 7, wherein the sealing surface has a channel to receive an isolator.

9. The one-piece process kit shield of claim 7, wherein the one-piece process kit shield is formed of aluminum or stainless steel.

10. A process chamber, comprising:
    a chamber wall defining an inner volume within the process chamber;
    a sputtering target disposed in an upper section of the inner volume;
    a substrate support having a support surface to support a substrate below the sputtering target;
    a one-piece process kit shield surrounding the sputtering target and the substrate support, comprising:
      a cylindrical body having an upper portion surrounding the sputtering target and a lower portion surrounding the substrate support, wherein the upper portion includes an adapter section extending radially outward and having a resting surface to support the one-piece process kit shield on the chamber wall and a sealing surface on which a chamber lid rests to seal off the inner volume;

a heat transfer channel extending through the upper portion; and a cover ring section extending radially inward from the lower portion and surrounding the substrate support, wherein an opening disposed through the cylindrical body and the cover ring section define a process volume-facing surface of the one-piece process kit shield, and wherein a diameter of the process volume-facing surface decreases from the upper portion to the cover ring section.

11. The process chamber of claim 10, wherein the heat transfer channel is disposed in the adapter section and the sealing surface has a channel to receive an isolator.

12. The process chamber of claim 11, wherein the channel of the sealing surface defines a bottom surface that includes an O-ring groove to receive an O-ring to form a vacuum seal between the adapter section and the chamber lid.

13. The process chamber of claim 11, wherein a first portion of the adapter section is disposed within the inner volume and a second portion of the adapter section is disposed outside of the inner volume.

14. The process chamber of claim 10, wherein the one-piece process kit shield further comprises:
a turbulence generating device disposed within the heat transfer channel.

15. The process chamber of claim 14, wherein the turbulence generating device comprises:

a helically shaped body to induce turbulence in a flow of a heat transfer medium within the heat transfer channel; and a base configured to engage with walls of the heat transfer channel to prevent the turbulence generating device from moving as the heat transfer medium flows past the turbulence generating device.

16. The process chamber of claim 10, wherein the substrate support is vertically movable, and further comprising:
a deposition ring disposed on and movable with the substrate support, wherein the cover ring section is configured to interface with the deposition ring to reduce formation of sputter deposits on a periphery of the substrate support.

17. The process chamber of claim 10, wherein a periphery of the sputtering target adjacent the upper portion is configured to form a convoluted gap having a dark space region.

18. The process chamber of claim 10, wherein the one-piece process kit shield is formed of aluminum or stainless steel.

19. The one-piece process kit shield of claim 1, wherein the cover ring section includes an annular wedge having a lower surface that extends radially inward and an upper surface that is sloped radially inwards and downwards, and wherein a distance between the lower surface and the upper surface decreases as the annular wedge extends radially inwards.

20. The one-piece process kit shield of claim 19, wherein the lower surface of the annular wedge is substantially planar.

* * * * *